(12) United States Patent
Darbha et al.

(10) Patent No.: US 6,639,302 B2
(45) Date of Patent: Oct. 28, 2003

(54) STRESS REDUCTION IN FLIP-CHIP PBGA PACKAGING BY UTILIZING SEGMENTED CHIP CARRIES

(75) Inventors: Krishna Darbha, Kirkland, WA (US); Miguel A. Jimarez, Newark Valley, NY (US); Matthew M. Reiss, Endwell, NY (US); Sanjeev B. Sathe, Binghamton, NY (US); Charles G. Woychik, Vestal, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/103,602

(22) Filed: Mar. 20, 2002

(65) Prior Publication Data

US 2003/0178649 A1 Sep. 25, 2003

(51) Int. Cl.[7] ................................................. H01L 29/06
(52) U.S. Cl. ....................................... 257/620; 257/618
(58) Field of Search ......................................... 257/620

(56) References Cited

U.S. PATENT DOCUMENTS

| | | | | | |
|---|---|---|---|---|---|
| 3,364,399 | A | * | 1/1968 | Warner | 257/587 |
| 5,051,807 | A | * | 9/1991 | Morozumi | 257/620 |
| 5,912,502 | A | * | 6/1999 | Kano | 257/620 |
| 6,078,096 | A | * | 6/2000 | Kimura et al. | 257/620 |
| 6,133,054 | A | * | 10/2000 | Henson | 438/17 |
| 6,147,876 | A | * | 11/2000 | Yamaguchi et al. | 361/766 |
| 6,497,943 | B1 | * | 12/2002 | Jimarez et al. | 428/209 |
| 2001/0036711 | A1 | * | 11/2001 | Urushima | 438/460 |

FOREIGN PATENT DOCUMENTS

| | | | | |
|---|---|---|---|---|
| JP | 5-21909 | | 1/1993 | H05K/1/02 |

* cited by examiner

Primary Examiner—Allan R. Wilson
(74) Attorney, Agent, or Firm—Schmeiser, Olsen & Watts; William H. Steinberg

(57) ABSTRACT

A method and structure to electrically couple a semiconductor device to a substrate that is divided into a plurality of segments. Alternatively, a semiconductor device may be divided into a plurality of segments and the plurality of segments are electrically coupled to a single substrate.

25 Claims, 3 Drawing Sheets

STRESS REDUCTION IN FLIP-CHIP PBGA PACKAGING BY UTILIZING SEGMENTED CHIP CARRIES

BACKGROUND OF THE INVENTION

1. Technical Field

The present invention relates to an electronic structure and associated method to reduce stress in a flip-chip PBGA package.

2. Related Art

A semiconductor device coupled to a substrate may experience thermal strain from thermal cycling operations, in light of coefficients of thermal expansions (CTE) differential between the semiconductor device and the substrate. Such thermal strains may result in mechanical failure of the semiconductor device and associated solder connections. Thus there is a need to inhibit such strains.

SUMMARY OF THE INVENTION

The present invention provides an electronic structure, comprising:
- a substrate, wherein the substrate is divided into a plurality of segments, and
- a semiconductor device electrically coupled to each of the segments.

The present invention provides an electronic structure, comprising:
- a substrate; and
- a semiconductor device electrically coupled to the substrate, wherein the semiconductor is divided into a plurality of segments.

The present invention provides a method for forming an electronic structure, comprising:
- dividing a substrate into a plurality of segments, and
- electrically coupling a semiconductor device to each segment of the plurality of segments of the substrate.

The present invention advantageously inhibits thermal strains within a semiconductor device and associated solder connections, wherein such thermal strains result from thermal cycling.

DETAILED DESCRIPTION OF THE INVENTION

Figure 1:
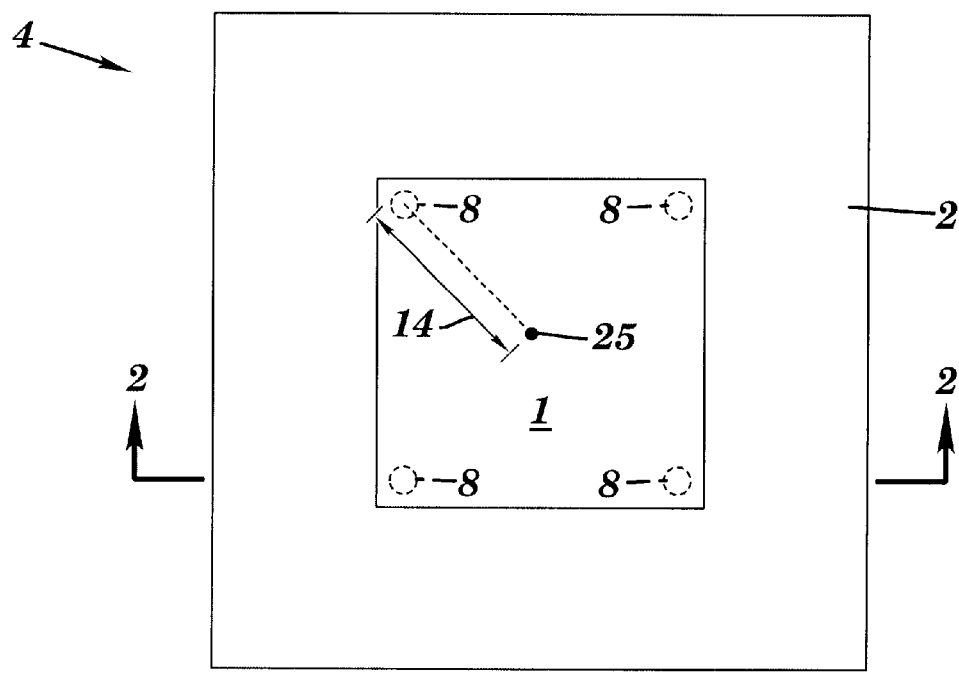
FIG. 1 depicts a top view of an electronic structure having a semiconductor device electrically coupled to a substrate, in accordance with embodiments of the present invention.
Figure 2:
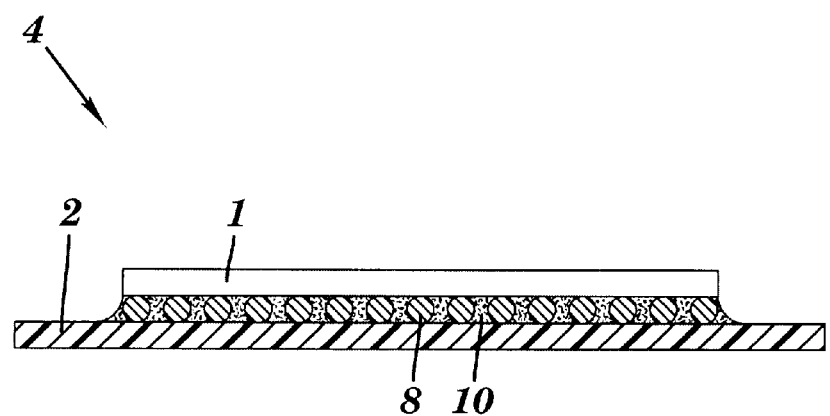
FIG. 2 depicts a cross sectional view taken along line 2—2 of FIG. 1, in accordance with embodiments of the present invention.

FIG. 1 illustrates a top view of an electronic structure 4 having a semiconductor device 1 electrically coupled to a substrate 2, in accordance with embodiments of the present invention. FIG. 2 illustrates a cross-sectional view taken along line 2—2 of FIG. 1 ("view 2—2"). The electronic structure 4 may include, inter alia, a flip chip plastic ball grid array module (FC-PBGA). The electronic structure 4 comprises a semiconductor device 1 and a substrate 2. The semiconduct or device 1 may include, inter alia, a semiconductor chip. The semiconductor device 1 is electrically coupled to the substrate using an electrical coupler (e.g., a Controlled Collapse Chip Connection (C4) solder ball 8). The space surrounding the C4 solder balls 8 may include an underfill 10. The substrate 2 may comprise, inter alia, a chip carrier (e.g., an organic chip carrier, a ceramic chip carrier, etc.) or a printed circuit board. The coefficient of thermal expansion (CTE) of the substrate 2 (e.g., 10 ppm/° C. to 15 ppm/° C.) is greater than the CTE of the semiconductor device (e.g., 3 ppm/° C. to 6 ppm/° C.). The difference between the aforementioned CTE's create stress within the electronic structure 4 during thermal cycling which can cause chip cracking, under fill delamination, and stress on the C4 solder ball connections 8. The CTE mismatch is a function of the distance from the neutral point (DNP) 14. The DNP 14 designates the distance from the zero stress region (i.e., neutral point) of the semiconductor device 1 to the furthest solder joint. As the DNP 14 increases the stresses within the electronic structure 4 increase. Therefore as the size of semiconductor device 1 increases, stresses within the electronic structure 4 increase. As stated supra, the preceding problem is observed during thermal cycling. One solution to the previously mentioned problem is illustrated in FIG. 3 and FIG. 4.

Figure 3:
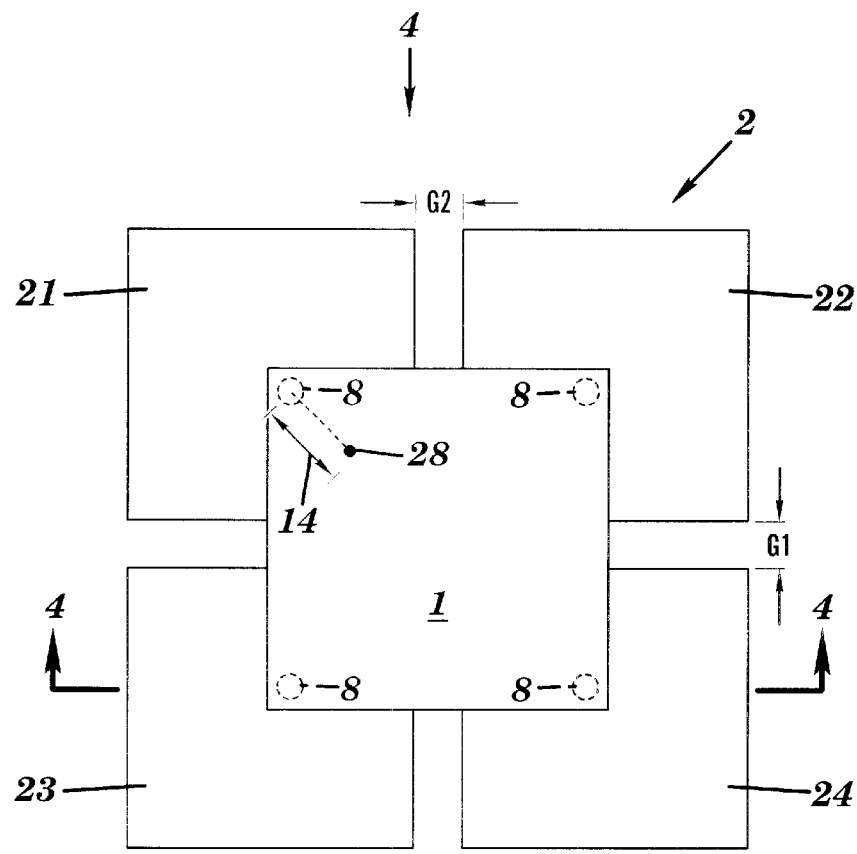
FIG. 3 depicts a top view of an electronic structure having a semiconductor device electrically coupled to a plurality of segments of a substrate, in accordance with embodiments of the present invention.
Figure 4:
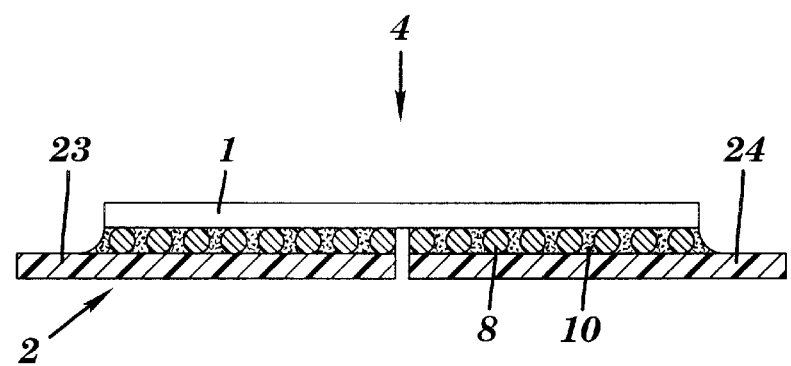
FIG. 4 depicts a cross sectional view taken along line 4—4 of FIG. 3, in accordance with embodiment's of the present invention.

FIG. 3 illustrates a modification of FIG. 1 showing a top view of an electronic structure 4 having a semiconductor device 1 electrically coupled to multiple segments of a substrate 2, in accordance with embodiments of the present invention. FIG. 4 illustrates a cross-sectional view taken along line 4—4 of FIG. 3 ("view 4—4"). The electronic structure 4 may include, inter alia, a flip chip plastic ball grid array (FC-PBGA) module. The electronic structure 4 comprises a semiconductor device 1 and a segmented substrate 2. The substrate 2 comprises segments 21, 22, 23, and 24. The substrate 2 may be segmented by any method known to a person of ordinary skill in the art such as, inter alia, use of a laser. The semiconductor device 1 may include, inter alia, a semiconductor chip. The semiconductor device 1 is electrically coupled to each segment 21–24 of the segmented substrate 2 using an electrical coupler (e.g., Controlled Collapse Chip Connection (C4) solder balls 8). A gap G1 and G2, as shown, may exist between segments 21–24 of the segmented substrate 2 and each gap G1 and G2 may be in a range of about 5–20 mils. The semiconductor device 2 may be electrically coupled to all of the segments 21–24 of the substrate 2 simultaneously by using a frame to align and hold the segments in place while reflowing the C4 solder balls simultaneously, or the semiconductor device 2 may be electrically coupled to each of the segments 21–24 of the substrate 2 independently. The space surrounding the C4 solder balls 8 may include an underfill 10. A surface tension between the semiconductor device 1 and the substrate 2 will hold the underfill 10 in place and prevent the underfill 10 from spilling over and filling any or all the gaps. The substrate 2 may comprise, inter alia, chip carrier (e.g., an organic chip carrier, a ceramic chip carrier, etc.) or a printed circuit board. The coefficient of thermal expansion (CTE) of the substrate 2 (e.g., 10 ppm/° C. to 15 ppm/° C.) is greater than the CTE of the semiconductor device 1(e.g., 3 ppm/° C. to 6 ppm/° C.). Segmenting the substrate 2 into smaller pieces (i.e., the segments 21–24) and electrically coupling the semiconductor device 1 to each of the segments 21–24 of the substrate 2 reduces the DNP 14 because the neutral point 28 has been shifted, from a central point that is symmetric with respect to all four corners of the semiconductor device 1 as shown in FIG. 1 (see neutral point 25), to a location that is non-symmetric with respect to the four corners such that neutral point 28 is closer to the furthest solder connection in each segment of the substrate 2. This reduces the stresses on the C4 solder connections 8, improving reliability. Segmenting the substrate 2 into four segments 21–24 (as shown in FIG. 3) is considered representative, although generally two or more segments may be used. Thus, the substrate 2 may be segmented into 2, 3, 4, 5, 6, 7, or 8 segments, or any other number of segments that exceed 8. The semiconductor device 1 may be symmetrically coupled to each segment of the substrate 2. A pair of segments of the substrate 2 within the plurality of segments may be congruent with respect to each other (i.e. superposable so as to be coincident throughout). Alternatively, there may be no segment congruency (i.e., no pair of the segments 21–24 are congruent with respect to each other). The original substrate 2 (before it is segmented) is not limited to any specific shape and may be segmented into a variety of geometrical shapes (e.g., triangle, square, rectangle, circle, etc.). Thus the segments of a substrate may each have the same geometrical shape. Alternatively, two or more segments of the substrate may have a different geometrical shape from each other (e.g., a first segment may have a first shape and a second segment may have a second shape, wherein the first shape differs from the second shape).

Figure 5:
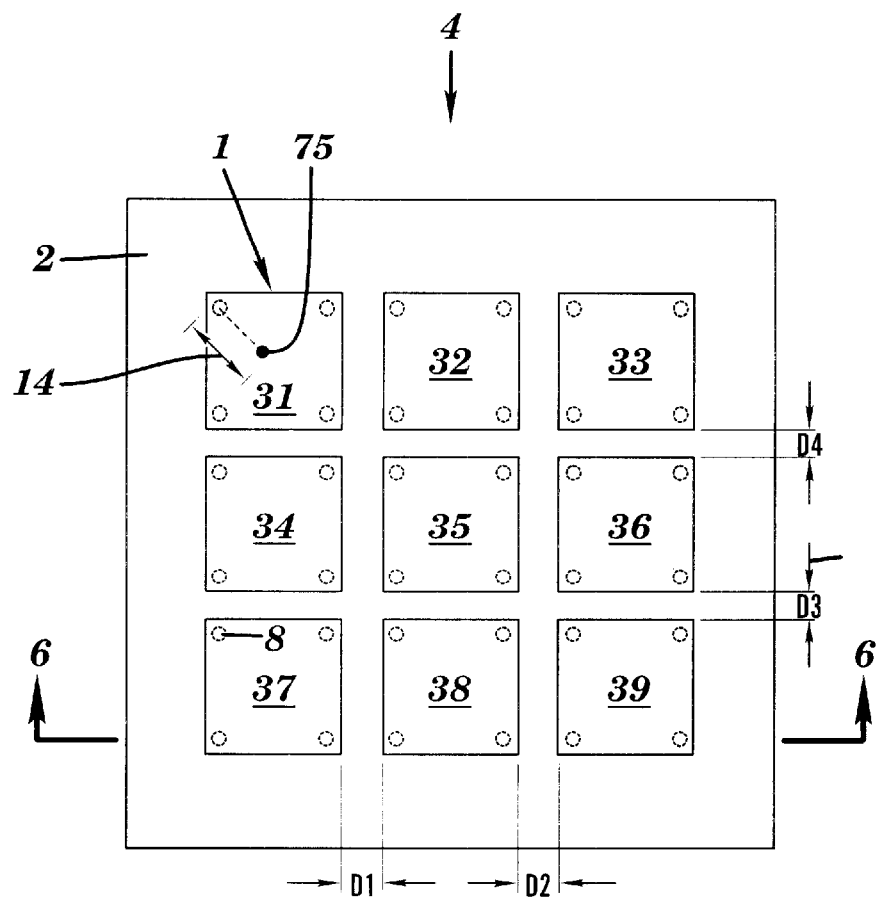
FIG. 5 depicts a top view of an electronic structure having a plurality of segments of a semiconductor device electrically coupled to a substrate, in accordance with embodiments of the present invention.
Figure 6:
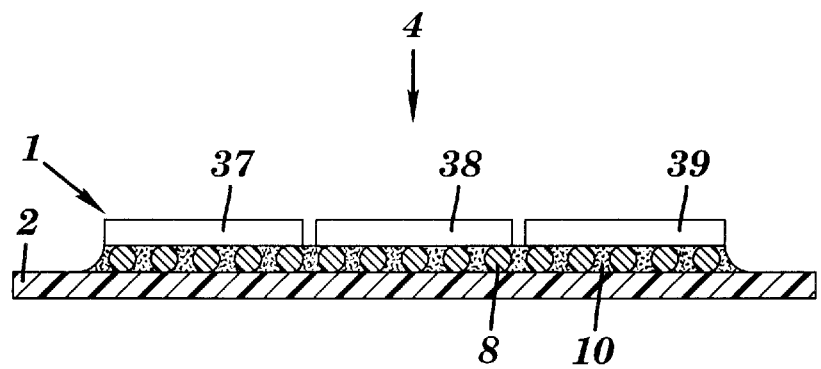
FIG. 6 depicts a cross sectional view taken along line 6—6 of FIG. 5, in accordance with embodiment of the present invention.

FIG. 5 illustrates a modification of FIG. 1 showing a top view of an electronic structure 4 having a segmented semiconductor device 1 electrically coupled to a substrate 2, in accordance with embodiments of the present invention. FIG. 6 illustrates a cross-sectional view taken along line 6—6 of FIG. 5 ("view 6—6"). The electronic structure 4 may include, inter alia, a flip chip plastic ball grid array (FC-PBGA) module. The electronic structure 4 comprises a segmented semiconductor device 1 and a substrate 2. The semiconductor device comprises segments 31–39. The semiconductor device 1 may include, inter alia, a semiconductor chip. The segmented semiconductor device 1 is electrically coupled to the substrate 2 using an electrical coupler (e.g., Controlled Collapse Chip Connection (C4) solder balls 8). A gap D1–D4, as shown, may exist between segments 31–39 of the segmented semiconductor device 1. Each gap may be in a range of 5–20 mils. If there may be a need to remove one or more of the segments 31–39 of the semiconductor device 1 then the gaps 31–39 should be at least 20 mils. The space surrounding the C4 solder balls 8 may include an underfill 10. The substrate 2 may comprise, inter alia, chip carrier (e.g.: an organic chip carrier, a ceramic chip carrier, etc.) or a printed circuit board. The coefficient of thermal expansion (CTE) of the substrate 2 (e.g., 10 ppm/° C. to 15 ppm/° C.) is greater than the CTE of the semiconductor device I (e.g., 3 ppm/° C. to 6 ppm/° C.). Segmenting the semiconductor device 1 into smaller segments (i.e., the segments 31–39) and electrically coupling each segment 31–39 of the semiconductor device 1 to the substrate 2 reduces the DNP 14 because the neutral point 75 has been shifted, from a central point that is symmetric with respect to all four corners of the semiconductor device 1 prior to segmenting as shown in FIG. 1 (see neutral point 25), to a location that is non-symmetric with respect to the four corners of the semiconductor device 1 prior to segmenting as shown in FIG. 1, such that neutral point 75 is closer to the furthest solder connection in each segment 31–39 of the semiconductor device 1. Reducing the DNP will reduce the stresses on the C4 solder connections 8, improving reliability. Each segment of the semiconductor device 1 may be greater than or equal to 5 millimeters. A pair of segments of the semiconductor device 1 within the plurality of segments may be congruent with respect to each other. Alternatively, there may be no segment congruency (i.e., no pair of the segments 31–39 are congruent with respect to each other). The segments of the semiconductor device 1 are not limited to any specific shape and may be segmented into a variety of geometrical shapes (e.g., triangle, square, rectangle, circle, etc.). Thus the segments of a semiconductor device may each have the same geometrical shape. Alternatively, two or more segments of the semiconductor device may have a different geometrical shape from each other (e.g., a first segment may have a first shape and a second segment may have a second shape, wherein the first shape differs from the second shape).

While embodiments of the present invention have been described herein for purposes of illustration, man y modifications and changes will become apparent to those skilled in the art. Accordingly, the appended claims are intended to encompass all such modifications and changes as fall within the true spirit and scope of this invention.

What is claimed is:

1. An electronic structure, comprising:
   a chip carrier, wherein the chip carrier is selected from the group consisting of a ceramic chip carrier and an organic chip carrier, and wherein the chip carrier is divided into a plurality of lateral segments, and
   a semiconductor device, wherein discrete sections of the semiconductor device are electrically coupled to each of the segments.

2. The electronic structure of claim 1, wherein the discrete sections of the semiconductor device are symmetrically coupled to each segment.

3. The electronic structure of claim 1, wherein the discrete sections of the semiconductor device are not symmetrically coupled to each segment.

4. The electronic structure of claim 1, wherein a first segment and a second segment of the plurality of segments are congruent with respect to each other.

5. The electronic structure of claim 1, wherein a first segment and a second segment of the plurality of segments are not congruent with respect to each other.

6. The electronic structure of claim 1, wherein the plurality of segments are square segments.

7. The electronic structure of claim 1, wherein the plurality of segments consists of 4 segments.

8. The electronic structure of claim 1, wherein the semiconductor device is a semiconductor chip.

9. A method for forming an electronic structure, comprising:
   dividing a substrate into a plurality of lateral segments, wherein the substrate is selected from the group consisting of a ceramic chip carrier, an organic chip carrier, and a printed circuit board, and
   electrically coupling discrete sections of the semiconductor device to each segment of the plurality of segments of the substrate.

10. The method of claim 9, wherein the semiconductor device is symmetrically coupled to each segment.

11. The method of claim 9, wherein the semiconductor device is not symmetrically coupled to each segment.

12. The method of claim 9, wherein a first segment and a second segment of the plurality of segments are congruent with respect to each other.

13. The method of claim 9, wherein a first segment and a second segment of the plurality of segments are not congruent with respect to each other.

14. The method of claim 9, wherein the plurality of segments consists of 4 segments.

15. The method of claim 10, wherein the plurality of segments are square segments.

16. The method of claim 9, wherein the substrate is an organic chip carrier.

17. The method of claim 9, wherein the substrate is a ceramic chip carrier.

18. The method of claim 9, wherein the substrate is a printed circuit board.

19. An electronic structure, comprising:
   a printed circuit board, wherein the printed circuit board is divided into a plurality of lateral segments, and
   a semiconductor device, wherein discrete sections of the semiconductor device are electrically coupled to each of the segments.

20. The electronic structure of claim 19, wherein the discrete sections of the semiconductor device are symmetrically coupled to each segment.

21. The electronic structure of claim 19, wherein the discrete sections of the semiconductor device are not symmetrically coupled to each segment.

22. The electronic structure of claim 19, wherein a first segment and a second segment of the plurality of segments are congruent with respect to each other.

23. The electronic structure of claim 19, wherein the plurality of segments are square segments.

24. The electronic structure of claim 19, wherein the plurality of segments consists of 4 segments.

25. The electronic structure of claim 19, wherein the semiconductor device is a semiconductor chip.

* * * * *